(12) United States Patent
Marshall et al.

(10) Patent No.: US 6,597,900 B1
(45) Date of Patent: Jul. 22, 2003

(54) CIRCUIT ARRANGEMENT PROVIDING IMPEDANCE TRANSLATION FILTERING

(75) Inventors: Christopher B. Marshall, Haywards Heath (GB); Brian J. Minnis, Crawley (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/557,604

(22) Filed: Apr. 25, 2000

(30) Foreign Application Priority Data

May 7, 1999 (GB) .............................. 9910454

(51) Int. Cl.[7] .............................................. H04B 1/26
(52) U.S. Cl. .................. 455/323; 455/313; 455/314; 455/326; 455/330; 455/333; 329/306; 329/308; 332/103
(58) Field of Search ................. 455/313, 314, 455/315, 316, 319, 333, 326, 323, 252.1, 330, 331; 329/306, 308; 332/103; 379/398

(56) References Cited

U.S. PATENT DOCUMENTS 4,359,609 A * 11/1982 Apfel ......................... 379/398
5,374,966 A * 12/1994 Weigand ..................... 348/707
5,465,420 A * 11/1995 Dougherty et al. .......... 455/333
6,009,317 A * 12/1999 Wynn ......................... 455/296
6,393,266 B1 * 5/2002 Molnar ....................... 455/323

FOREIGN PATENT DOCUMENTS

GB           2100949 A        1/1983

* cited by examiner

Primary Examiner—Edward F. Urban
Assistant Examiner—Marceau Milord
(74) Attorney, Agent, or Firm—Dicran Halajian

(57) ABSTRACT

A circuit arrangement for providing impedance translation filtering comprises a first path and a second path. In a base band variant the first path is a feed forward path which comprises first and second series connected transconductance gain stages (10, 12), and the second path is a feedback which comprises third and fourth transconductance gain stages (18, 20), each having an inverting output. An output of the first gain stage is coupled to an input of the fourth gain stage. In operation, the impedance presented at its output determines the impedance presented at an input of the circuit arrangement.

10 Claims, 7 Drawing Sheets

CIRCUIT ARRANGEMENT PROVIDING IMPEDANCE TRANSLATION FILTERING

Figure 1:
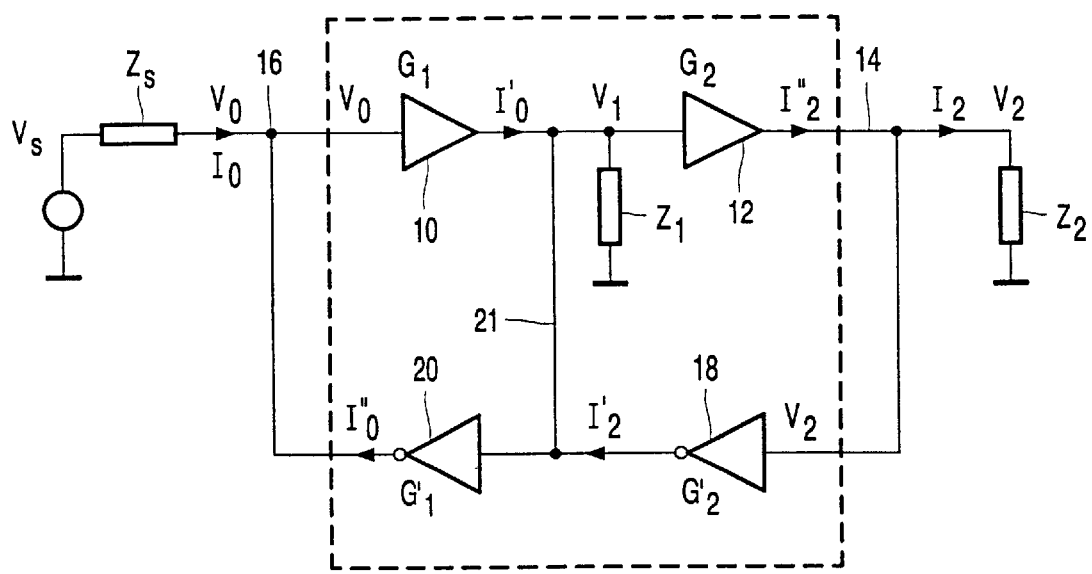

The present invention relates to a circuit arrangement providing impedance translation filtering. An application of the present invention is effecting high frequency (i.f. or r.f.) filtering in receivers and transmitters.

Impedance control circuits are known, for example from UK Patent Specification 2,100,949A, for use in subscriber line interface circuits in telephone systems. The cited specification discloses an idealised transmission system having first and second circuits along which signals pass. A current controlled feedback loop in the first circuit is used to control the impedance of that circuit by a single element so that the circuit with feedback initiates an idealised circuit having an impedance representing the first circuit. Thus the current—controlled feedback loop sets the impedance of the circuit. This cited specification does not disclose using impedance translation for effecting high frequency filtering.

According to a first aspect of the present invention there is provided a circuit arrangement comprising a first path including a first frequency translation stage, a second path including a second frequency translation stage, an input to the first path being connected to an output of the second path, an output of the first path being connected to an input of the second path, and means for connecting a source of local oscillator signals to the first and second frequency translation stages, wherein the frequency of an input signal is translated by the local oscillator signals to a lower frequency and wherein the impedance as viewed from a higher frequency end of the circuit arrangement is determined by the impedance presented at a lower frequency end of the circuit arrangement.

According to a second aspect of the present invention there is provided a circuit arrangement comprising a first path and a second path, the first path comprising first and second series connected transconductance gain stages, the second path comprising third and fourth transconductance gain stages, each having an inverting output, an input of the third gain stage being coupled to an output of the second gain stage, the output of the fourth gain stage being coupled to an input of the first gain stage, and an output of the first gain stage being coupled to an input of the fourth gain stage, whereby an impedance presented at an output of the second gain stage determines the input impedance presented at the input of the first gain stage.

According to a third aspect of the present invention there is provided a quadrature receiver comprising input means for connection to a signal source, input signal dividing means coupled to the input means, the dividing means having first and second outputs, first and second circuit arrangements coupled to the first and second outputs, respectively, the first circuit arrangement comprising a first path and a second path, the first path comprising a first transconductance mixer having an output and a first gain stage coupled to the output of the first mixer, and the second path comprising a second transconductance gain stage having an inverting output and second transconductance mixer coupled to the output of the second gain stage, the second mixer having an inverting output coupled to an input of the first mixer, an output of the first gain stage being coupled to an input of the second gain stage, the output of the second mixer being coupled to an input of the first mixer, and the output of the first mixer being coupled to an input of the second mixer, and the second circuit arrangement comprising a first path and a second path, the first path comprising a third transconductance mixer having an output and a third gain stage coupled to the output of the third mixer, the second path comprising a fourth transconductance gain stage having an inverting output and a fourth transconductance mixer coupled to the output of the fourth gain stage, the fourth mixer having an inverting output coupled to an input of the third mixer, an output of the third gain stage being coupled to an input of the fourth gain stage, the output of the fourth mixer being coupled to an input of the third mixer, and the output of the third mixer being coupled to an input of the fourth mixer, and a local oscillator signal source having first and second quadrature related outputs, the first output being coupled to the first and second mixers and the second output being coupled to the third and fourth mixers.

According to a fourth aspect of the present invention there is provided a transmitter comprising first and second means for connection to respective first and second signal sources, first and second circuit arrangements coupled to the respective means for connection to the first and second signal sources, the first circuit arrangement comprising a first path and a second path, the first path comprising a first transconductance gain stage having an inverting output and a first transconductance mixer coupled to the output of the first gain stage, the first mixer having an inverting output, the second path comprising a second transconductance mixer having an output and a second gain stage coupled to the output of the second mixer, the output of the second mixer being coupled to an input of the first mixer, an output of the second gain stage being coupled to an input of the first gain stage, the output of the first mixer being coupled to an input of the second mixer and to a signal combining means, and the second circuit arrangement comprising a first path and a second path, the first path comprising a third transconductance gain stage having an inverting output and a third transconductance mixer coupled to the output of the third gain stage, the third mixer having an inverting output, the second path comprising a fourth transconductance mixer having an output and fourth transconductance gain stage coupled to the output of the fourth mixer, the output of the fourth mixer being coupled to an input of the third mixer, an output of the fourth gain stage being coupled to an input of the third gain stage, and the output of the third mixer being coupled to an input of the fourth mixer and to the signal combining means.

Combining the ability to be able to use the impedance presented at the output of a circuit arrangement to determine its input impedance with pairs of quadrature mixers performing down- and up-mixing allows a well controlled impedance variation at base band to also produce an impedance variation and thereby a filtering effect at high (i.f. or r.f.) frequencies. The effective r.f. filtering may then be used with advantage in transceiver architectures, for example to avoid external, off-chip components, or to relax performance requirements.

Figure 2:
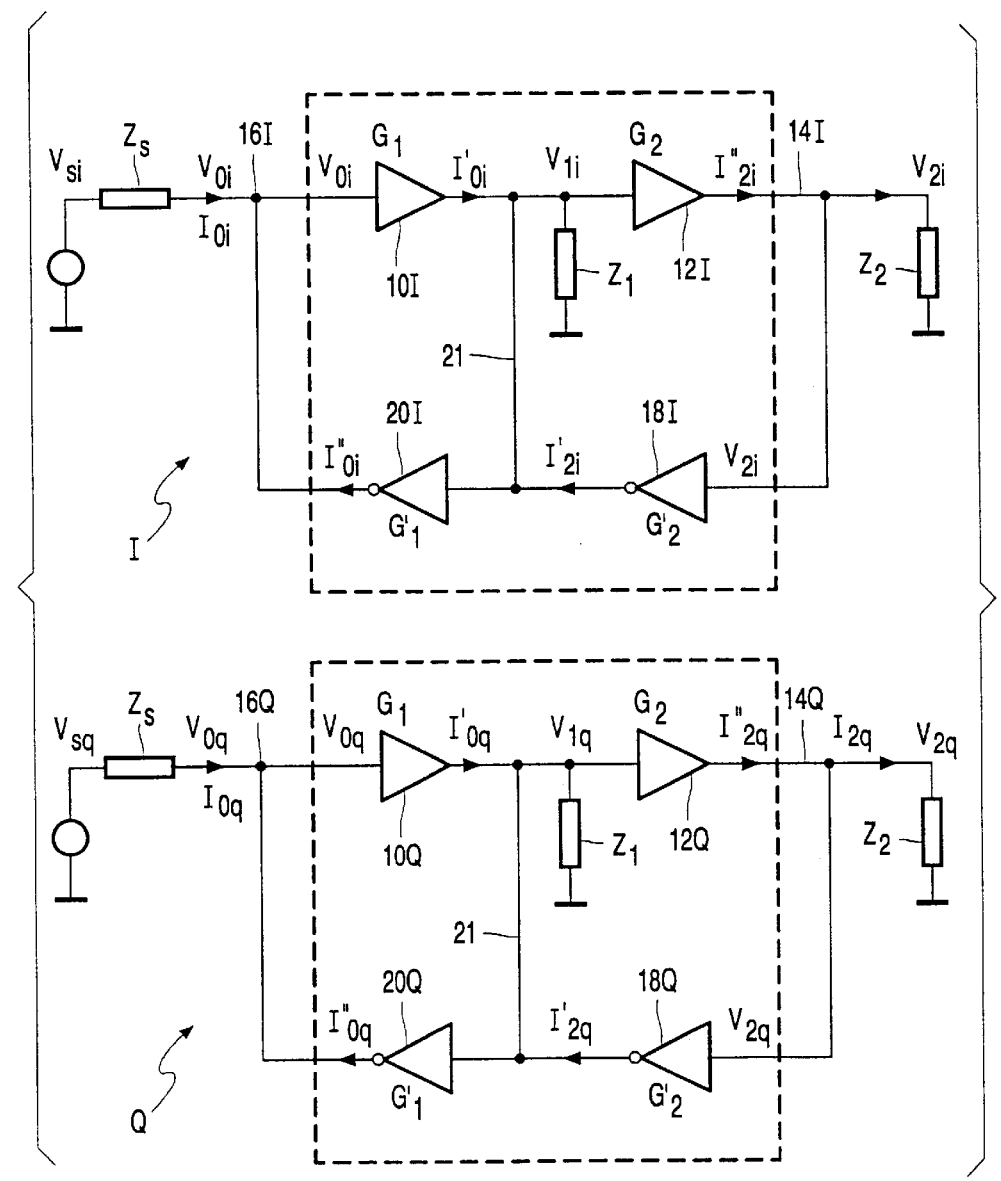
Figure 3:
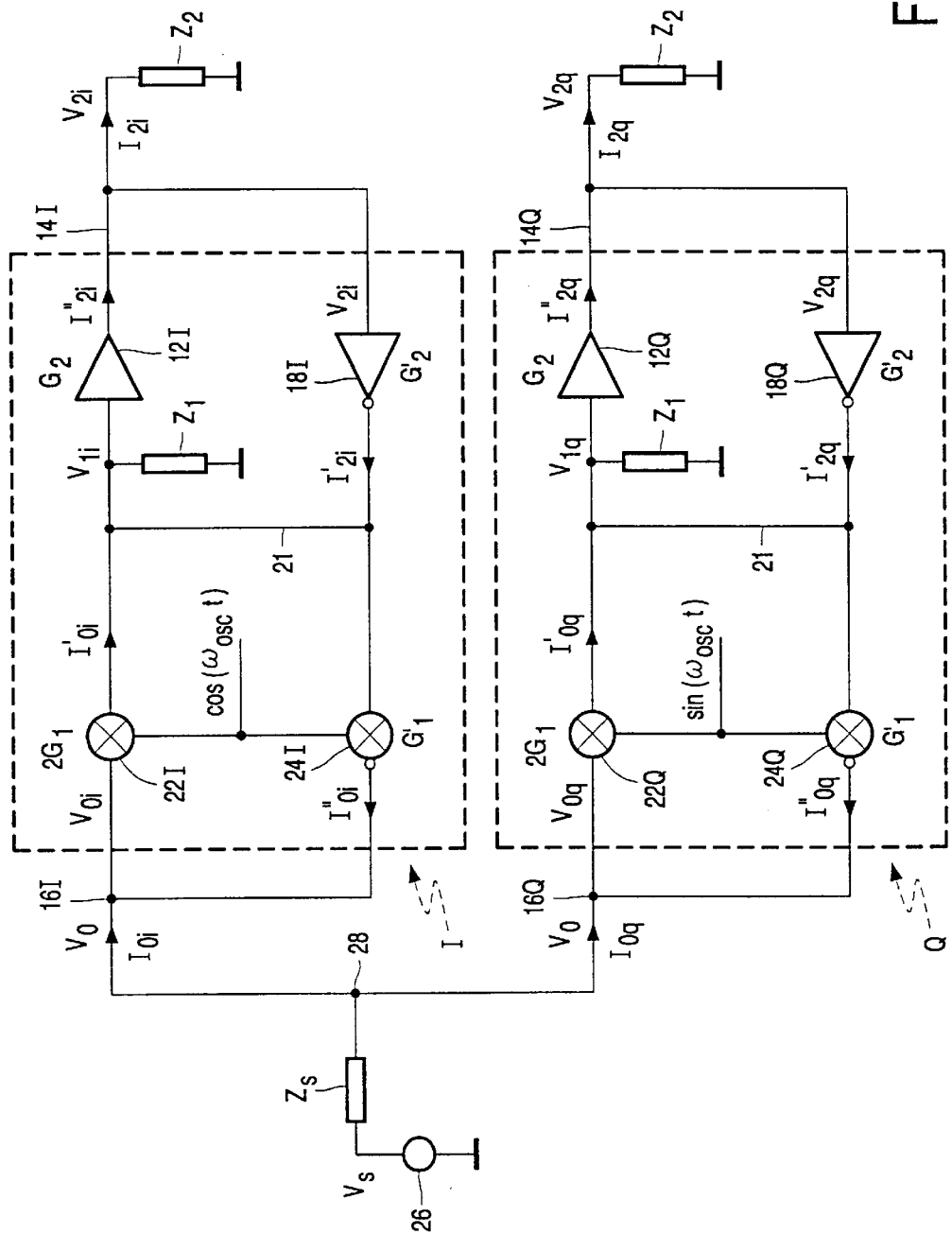
Figure 4:
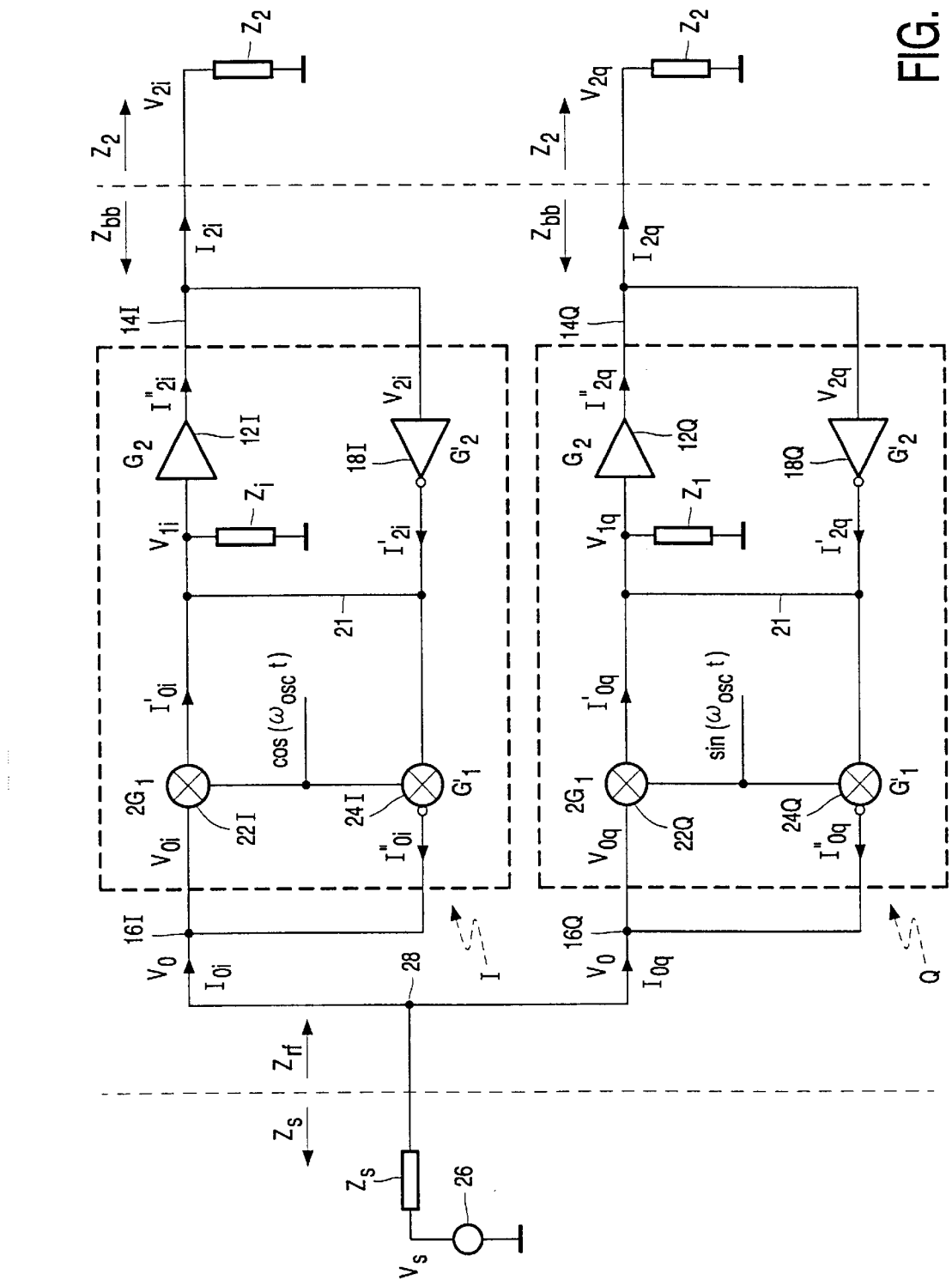
Figure 5:
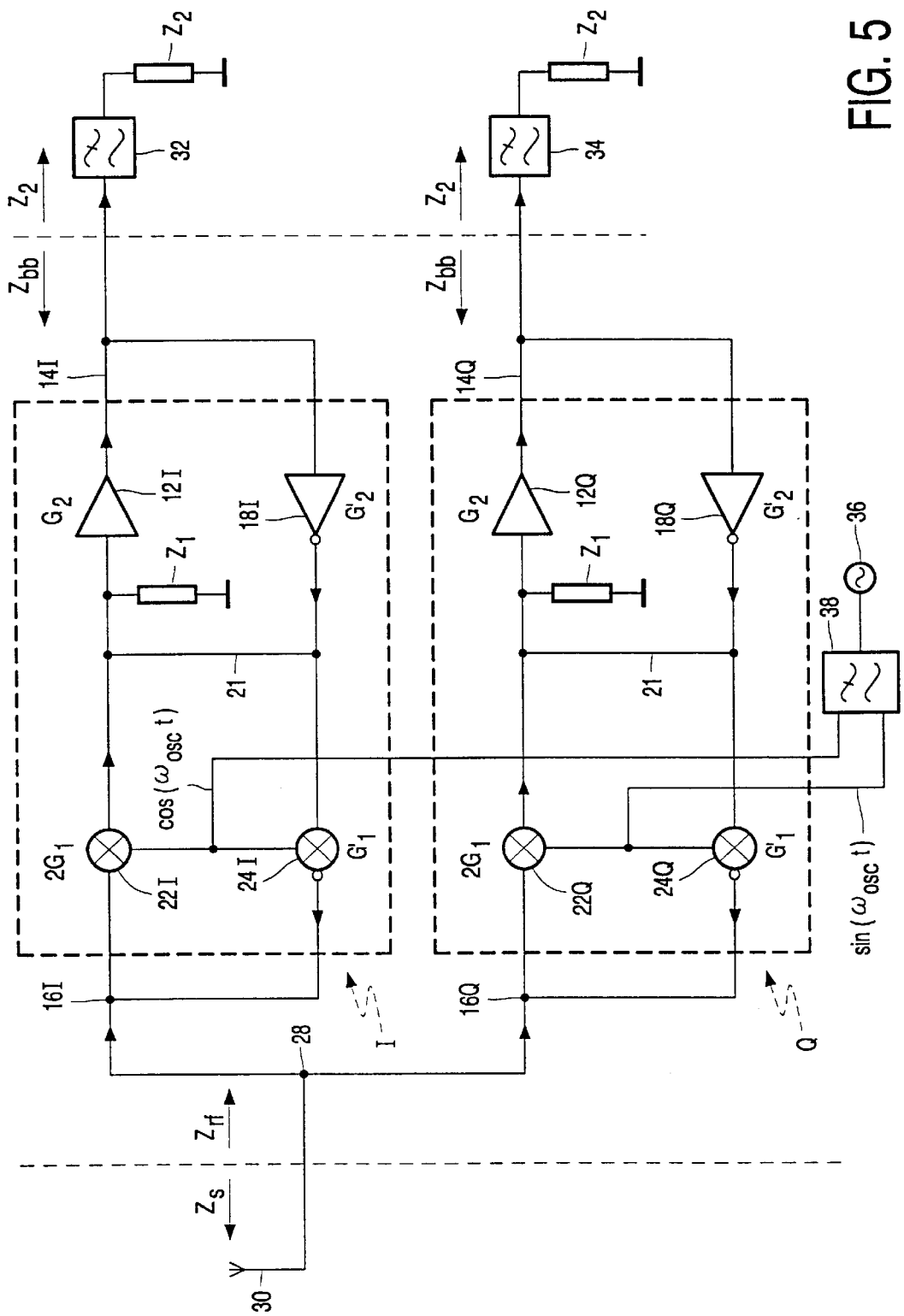
Figure 6:
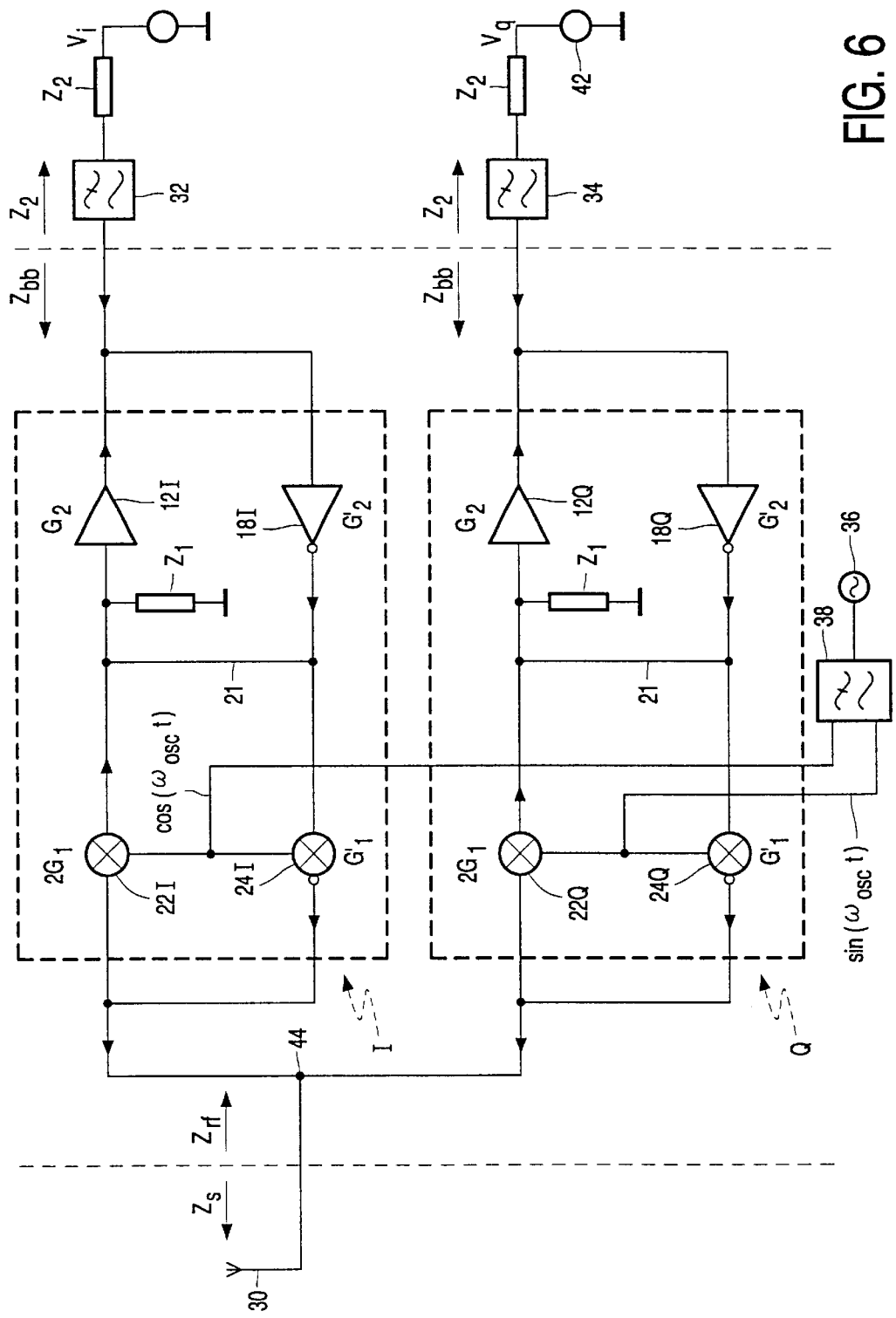
Figure 7:
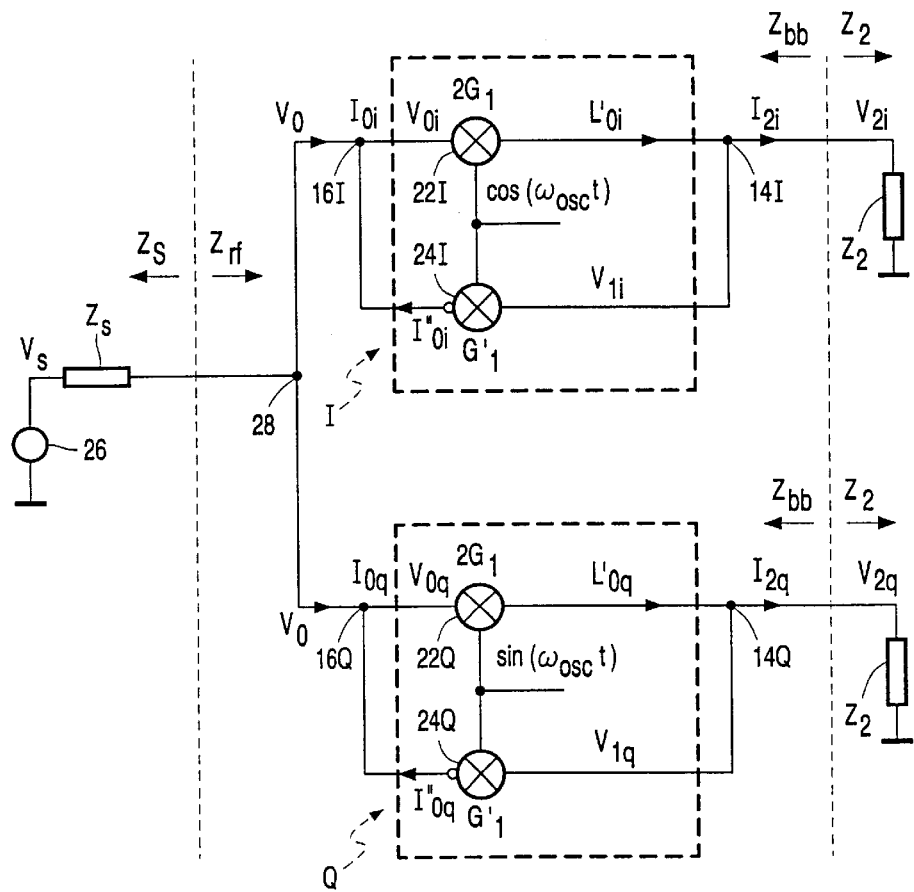

The present invention will now be described, by way of example, with reference to the accompanying drawings, wherein FIG. 1 is a block schematic diagram of a baseband model of the circuit arrangement in accordance with the present invention, FIG. 2 is a block schematic diagram of an ideal baseband quadrature model of the circuit arrangement made in accordance with the present invention, FIG. 3 is a block schematic diagram of a quadrature frequency—shifting model, FIG. 4 is a version of FIG. 3 showing impedance translation, FIG. 5 is a block schematic diagram of a quadrature receiver, FIG. 6 is a block schematic diagram of a quadrature transmitter, and FIG. 7 is a block schematic of a reciprocal impedance translation stage.

In the drawings the same reference numerals have been used to indicate corresponding features.

Referring to FIG. 1, the basic circuit block is shown within the broken lines and comprises a first, feed forward path comprising first and second series connected transconductance amplifiers 10, 12 having gains of $G_1$ and $G_2$, respectively. A second, feedback path is connected between the output 14 of the basic circuit block and the input 16 to the basic circuit block. The second path comprises a third and fourth series connected transconductance amplifiers 18, 20 having negative gains $G_2', G_1'$ and inverting outputs. The output of the first amplifier 10 and the input of the fourth amplifier 20 are interconnected by a conductive link 21. The first to fourth amplifiers 10, 12, 18 and 20 may be differential amplifiers and the inverted outputs of the third and fourth amplifiers 18, 20 may be obtained by swapping over their outputs. The input impedance to the second amplifier 12 is represented by a resistor $z_1$ but is more likely to be implemented as an RC filter. The impedance value of $z_1$ is preferably high. The transconductance amplifiers give an output current proportional to the input voltage. As will be demonstrated by the following mathematical analysis, the impedance $z_s$ seen at the input 16 of the circuit arrangement is determined by the impedance $z_2$ presented at the output 14 of the circuit block.

For convenience of reference, a source voltage $V_s$ is shown connected by the input impedance $z_s$ to an input 16. A voltage $V_0$ at the input of the amplifier 10 is amplified and represented by a current $I_0'$ on its output. A voltage $V_1$ at the input of the amplifier 12 is amplified and represented by a current $I_2''$. A current $I_2$ flows into the impedance $z_2$ and produces a voltage $V_2$. The voltage $V_2$ on the input of the amplifier 18 is transconducted to a current $I_2'$. Lastly a voltage $V_1$ on the input of the amplifier 20 is transconducted to a current $I_0''$.

Starting with the conditions at the centre $$V_1 = (I_0' + I_2')(z_1) \qquad (1)$$

Now $$I_0' = G_1 V_0$$

and $$I_2' = G_2 V_2$$

so $$I_0' + I_2' = G_1 V_0 + G_2' V_2$$

giving $$V_1 = (G_1 V_0 + G_2' V_2) z_1 \qquad (2)$$

This gives the output current as:

$$I_2 = G_2 V_1$$

Substituting (2) for $V_1$ gives:

$$I_2 = (G_1 G_2 V_0 + G_2 G_2' V_2) z_1 \qquad (3)$$

and the current drawn at the input as:

$$I_0 = -G_1' V_1$$

Substituting (2) for $V_1$ gives:

$$I_0 = (-G_1 G_1' V_0 - G_1' G_2' V_2) z_1 \qquad (4)$$

These two equations define the currents at output and input as a function of the voltages at the output and input.

Now the current at the output is determined by the load impedance present $$V_2 = I_2 z_2 \qquad (5)$$

so using this relationship then gives for the output current from eqn. (3) gives $$I_2 = G_1 G_2 V_0 z_1 + G_2 G_2' I_2 z_1 z_2$$

$$I_2 = G_1 G_2 V_0 z_1 + G_2 G_2' I_2 z_1 z_2 \qquad (6)$$

$$\Rightarrow I_2 (1 - G_2 G_2' z_1 z_2) = G_1 G_2 V_0 z_1$$

$$\Rightarrow I_2 = V_0 \left\{ \frac{G_1 G_2 z_1}{1 - G_2 G_2' z_1 z_2} \right\}$$

and for the input current from eqn. (4)

$$I_0 = -G_1 G_1' V_0 z_1 - G_1' I_2 z_1 z_2$$

using (6) then $$I_0 = -G_1 G_1' V_0 z_1 - \frac{G_1' G_2' z_1 z_2 \cdot G_1 G_2 z_1}{1 - G_2 G_2' z_1 z_2} V_0 \qquad (7)$$

$$\Rightarrow I_0 = V_0 \left\{ \frac{-G_1 G_1' z_1 + G_1 G_1' z_1 \cdot G_2 G_2' z_1 z_2 - G_1' G_2' z_1 z_2 G_1 G_2 z_1}{1 - G_2 G_2' z_1 z_2} \right\}$$

$$\Rightarrow I_0 = V_0 \left\{ \frac{-G_1 G_1' z_1}{1 - G_2 G_2' z_1 z_2} \right\}$$

Given the load impedance, this then has defined the currents flowing in the output and input circuits. The minus sign in expression (7) is explained by the definitions of the current flow, and the expectation that $G_1$ is negative.

Having derived the current at the input the input impedance, $z_{in}$ presented by the block can be calculated, which is simply $$z_{in} = \frac{V_0}{I_0} = \frac{G_2 G_2' z_1 z_2 - 1}{G_1 G_1' z_1} \qquad (8)$$

To see how the circuit behaves when the feedback loop gain is high, if $|G_2 G_2' z_1 z_2| >> 1$
then $$z_{in} \approx \frac{G_2 G_2' z_1 z_2}{G_1 G_1' z_1} \qquad (9)$$

$$\Rightarrow z_{in} \approx \frac{G_2 G_2'}{G_1 G_1'} \cdot z_2$$

The important property of the circuitry block is thus demonstrated, that the impedance at the input is related to (and usually proportional to) the impedance present at its output.

In the meantime however, to complete the description, the signal voltage at the output is simply obtained by the output current flowing in the load impedance Eqn.(6) in Eqn. (5)⇒

$$V_2 = \frac{G_1 G_2 z_1 z_2}{1 - G_2 G_2' z_1 z_2} \cdot V_0 \qquad (10)$$

The expression makes sense, as it is the forward gain multiplied by the closed loop response (1—loop gain)$^{-1}$ for the feedback loop formed by the output and internal circuit. The loop formed around the input circuit naturally does not have an influence, for a given voltage input $V_0$. Again, to see how the circuit behaves when the feedback loop gain is high, if $|G_2 G_2' z_1 z_2| >> 1$ then the voltage gain (10) simplifies to $$V_2 \approx \frac{-G_1}{G_2'} V_0 \qquad (11)$$

Intuitively this is the forward gain $G_1 z_1$ followed by the feedback $G_2' z$, with the internal impedance $z_1$ dropping out of the expression, and the minus signal explainable by $G_2'$ being negative.

The current gain, the ratio of the currents flowing in the output and the input is also of interest
Eqns. (6) and (7)⇒

$$\frac{I_2}{I_0} = \frac{G_1 G_2 z_1}{-G_1 G_1' z_1} = \frac{G_2}{G_1'} \qquad (12)$$

which is as it should be, since the voltage $V_1$ is common input to both transconductor amplifiers 12, 20, so the ratio of the currents is that of the gains. The minus sign reflects the fact that the currents are defined in FIG. 1 flowing in opposite directions, so $G_1'$ is negative. The result is also consistent with the impedance relationship (9) and the voltage scaling between input and output (11).

Now the application of the circuit block together with source circuit, with the voltage source $V_s$ and source impedance $z_s$ will be examined. The voltage at the input of the block is then determined by the voltage dropped due to the current flow in the source impedance:

$$V_0 = V_s - I_0 z_s \qquad (13)$$

substituting in the current flow result (7) we have $$V_0 = V_s - V_0 \left\{ \frac{-G_1 G_1' z_1 z_s}{1 - G_2 G_2' z_1 z_2} \right\} \qquad (14)$$

$$\Rightarrow V_0 \left\{ 1 - \frac{G_1 G_1' z_1 z_s}{1 - G_2 G_2' z_1 z_2} \right\} = V_s$$

$$\Rightarrow V_0 = V_s \left\{ \frac{1}{1 - \frac{G_1 G_1' z_1 z_s}{1 - G_2 G_2' z_1 z_2}} \right\}$$

This makes sense as there are two, nested feedback loops, the first one with loop gain $G_1 G_1' z_1 z_s$ having its loop gain modified by the second loop with loop gain $G_2 G_2' z_1 z_2$.

Further rearrangement of (14) then gives the more manageable expression $$V_0 = V_s \left\{ \frac{1 - G_2 G_2' z_1 z_2}{1 - G_2 G_2' z_1 z_2 - G_1 G_1' z_1 z_s} \right\} \qquad (15)$$

It is important to note the basic effect, that the voltage developed at the input to the circuit block is being determined, as a result of the feedback, by the impedance $z_2$ presented at its output. This means that if a filter which presents a frequency—dependent input impedance is present at the output, then its effect will also be felt at the input of the circuit block.

If there is strong feedback, $|G_2 G_2' z_1 z_2| >> 1$ then $$V_0 \approx V_s \left\{ \frac{G_2 G_2' z_2}{G_2 G_2' z_2 + G_1 G_1' z_s} \right\} \qquad (16)$$

Note again that the internal impedance $z_1$ has dropped out of the expression; it determines the internal impedance level and the feedback loop gains, only indirectly influence the transfer function between input and output. If $|G_1 G_1' z_s| >> |G_2 G_2' z_2|$ as will be the case for example if $z_2$ is small, for an out-of-band signal, then $$V_0 \approx V_s \frac{G_2 G_2' z_2}{G_1 G_1' z_s} \qquad (17)$$

so that if $G_1$, $G_1'$, $G_2$, $G_2'$, $z_s$ are substantially independent of frequency, then $$V_0 z_2 \cdot V_s \qquad (18)$$

and the signal level at the input of the block is simply proportional to the load impedance at the baseband output of the block, $z_2$.

Turning now to the signal level at the output, combining equations (10) and (14) gives $$V_2 = V_s \frac{G_1 G_2 z_1 z_2}{(1 - G_2 G_2' z_1 z_2)} \cdot \frac{1}{\left(1 - \left(\frac{G_1 G_1' z_1 z_s}{1 - G_2 G_2' z_1 z_2}\right)\right)} \qquad (19)$$

$$\Rightarrow V_2 = V_s \frac{G_1 G_2 z_1 z_2}{(1 - G_2 G_2' z_1 z_2 - G_1 G_1' z_1 z_s)}$$

So the forward gain voltage gain of each stage, being the transconductance multiplied by the load impedances, is modified by the feedback loop gains.

If there is strong feedback, $|G_1 G_1' z_1 z_2| >> 1$ or $|G_2 G_2' z_1 z_2| >> 1$ then $$V_2 \approx -V_s \frac{G_1 G_2 z_1 z_2}{G_2 G_2' z_1 z_2 + G_1 G_1' z_1 z_s} \qquad (20)$$

$$\Rightarrow V_2 \approx -V_s \frac{G_1 G_2 z_2}{G_1 G_1' z_s + G_2 G_2' z_2} \text{ or}$$

$$V_2 \approx -V_s \frac{G_1}{G_2'} \cdot \frac{z_2}{\frac{G_1 G_1'}{G_2 G_2'} z_s + z_2}$$

which is consistent with the impedance scaling result, as can be seen by reformulating as $$V_2 \approx -V_s \frac{G_1}{G_2'} \cdot \frac{\frac{G_2 G_2'}{G_1 G_1'} z_2}{z_2 + \frac{G_2 G_2'}{G_1 G_1'} z_2}$$

and then using (9) to re-express in terms of the input impedance $z_{in}$ presented is by the block, giving $$V_2 \approx -V_s \frac{G_1}{G_2'} \cdot \frac{z_{in}}{z_s + z_{in}} \quad (21)$$

This is a satisfying result; a potential divider is being formed by $z_{in}$ and $z_s$, with the voltage then being amplified to the output with gain $-G_1/G_2'$ as per equation (11).

Remember that $G_2'$ is negative.

If as can be the case for an out-of-band signal the impedance $$|z_2| \ll \left| G_1 \frac{G_1'}{G_2 G_2'} z_s \right|$$

then (20) can be further simplified to $$V_2 \approx -V_s \frac{G_2}{G_1'} \cdot \frac{z_2}{z_s} \quad (22)$$

and if $G_1$, $G_1'$, $G_2$, $G_2'$, $z_s$ are all independent of frequency then $$V_2 z_2 \cdot V_s$$

The signs all appear to be correct if as expected the signs of $G_1'$ and $G_2'$ are negative.

This also ensures stability of the feedback loops, $$\frac{1}{1-\beta}$$

where $\beta$ should be negative.

The performance can be improved by making $l_0'=l_2'$ more closely, that is by increasing $z_1$ directly or indirectly via buffering circuitry between the current summing junction and the drive to the transconductor amplifiers.

Referring to FIG. 2 which shows an ideal quadrature model. Comparing FIGS. 1 and 2 it is evident that the in-phase I and quadrature phase Q circuits are of identical layout with the exceptions that the reference numbers of the transconductance amplifiers has "I" and "Q" added and the subscripts "i" and "q" have been used in the referencing of the various voltages and currents. In the interests of brevity a detailed description will not be given of FIG. 2 as the description of the respective I and Q circuits has been amply covered with reference to FIG. 1.

FIG. 3 is a variant of FIG. 2 in which the transconductance ammplifiers 101, 201, 10 Q and 20 Q have been replaced by transconductance mixers 221, 241, 22 Q and 24 Q, respectively. The mixers 221 and 22 Q have double the gain of the mixers 241 and 24 Q. Also the mixers 241 and 24 Q have inverting outputs.

A signal source 26 is coupled by way of a signal splitter 28 to the inputs 161 and 16 Q of the respective circuit blocks. Quadrature related local oscillator signals are supplied to the mixers 221, 241 and 22 Q, 24 Q, respectively.

In order to explain the operation of FIG. 3 in general terms it will be assumed for simplicity that the gains paths are identical and that there is a perfect 90° phase shift between them. There is a frequency down conversion in the mixer 221 or 22 Q and a frequency up conversion in the mixer 241 or 24 Q. Accordingly it is necessary to consider the effects of both frequency translations in the following mathematical analysis.

In the case of frequency translation down by $(-f^{osc})$:
Input voltage to mixer 221, $$V_0 = \alpha_0 \sin(2\pi f t - \phi_0) \quad (23)$$

$$I_{0i}' = \frac{2G_1 a_0}{2} \{\sin(2\pi(f - f_{osc})t - \phi_0) + \sin(2\pi(f + f_{osc})t - \theta_0)\}$$

The double frequency term is removed by filtering, leaving $$I_{0i}' = G_1 \alpha_0 \sin(2\pi(f-f_{osc})t - \phi_0) \quad (24)$$

and similarly $$I_{0q}' = \frac{2G_1 a_0}{2} \{\cos(2\pi(f - f_{osc})t - \phi_0) - \cos(2\pi(f + f_{osc})t - \theta_0)\}$$

which with the double frequency removed gives $$I_{0q}' G_1 \alpha_0 \cos(2\pi(f-f_{osc})t - \phi_0) \quad (25)$$

that is for each I and Q path a gain of $G_1$ and a frequency translation down by $(-f_{osc})$ In the case of frequency translation up by $(+f_{osc})$:
Input voltage to mixer 241, $$V_{1i} = \alpha_1 \sin(2\pi(f-f_{osc})t - \phi_1) \quad (26)$$

Input voltage to mixer 24 Q, $$V_{1q} = \alpha_1 \cos(2\pi)f - f_{osc})t - \phi_1) \quad (27)$$

then $$I_0'' = V_{1i} G_1' \cos(2\pi f_{osc}t) + V_{1q} G_1' \sin(2\pi f_{osc}t)$$

so by standard trigonometry $$I_0'' G_1' \alpha_1 \{\sin(2\pi(f-f_{osc})t - \phi_1)\cos(2\pi f_{osc}t) + \cos(2\pi(f-f_{osc})t - \phi_1)\sin(2\pi f_{osc}t)\}$$

$$\Rightarrow I_0'' G_1' \alpha_1 \sin(2\pi(f-f_{osc})f - \phi_1 + 2\pi f_{osc}t)$$

$$\Rightarrow I_0'' G_1' \alpha_1 \sin(2\pi f t - \phi_1) \quad (28)$$

that is, a gain of $G_1'$ and a frequency translation up by $(+f_{osc})$ takes place.

Putting the two parts together to build an impedance coupling arrangement including a frequency translation as in FIG. 3. First we set up an input signal:

$$V_s = \alpha_s \sin(2\pi f_s t - \phi_s) \quad (29)$$

and make $z_s, z_1, z_2$ each a function of frequency; $z_s(f), z_1(f), z_2(f)$ then from (15)

$$V_0 = a_s \sin(2\pi f_s t - \phi_s) \quad (30)$$

$$\left\{ \frac{1 - G_2 G_2' z_1(f_s - f_{osc}) z_2(f_s - f_{osc})}{1 - G_2 G_2' z_1(f_s - f_{osc}) z_2(f_s - f_{osc}) - G_1 G_1' z_1(f_s - f_{osc}) z_s(f_s)} \right\}$$

where the voltage $V_0$ appearing at the block input is the input signal, subjected to the input impedance applying at $f_s$ and the baseband impedances applying at the frequency of the mixed down signal, at $(f_s - f_{osc})$ The approximations used above still apply, so if there is strong feedback, $|G_2 G_2' z_1(f_s - f_{osc}) z_2(f_s - f_{osc})| \gg 1$, then $$V_0 \approx a_s \sin(2\pi f_s t - \phi_s) \left\{ \frac{G_2 G_2' z_2(f_s - f_{osc})}{G_2 G_2' z_2(f_s - f_{osc}) + G_1 G_1' z_s(f_s)} \right\} \quad (31)$$

and if the loop gain around the source circuit is greater than that around the load circuit, $|G_1 G_1' z_s(f_s)| \gg |G_2 G_2' z_2(f_s - f_{osc})|$ $$V_0 \approx a_s \sin(2\pi f_s t - \phi_s) \cdot \frac{G_2 G_2'}{G_1 G_1'} \cdot \frac{z_2(f_s - f_{osc})}{z_s(f_s)} \quad (32)$$

Now looking at the output voltage, from (19), and bearing in mind (24), a signal is produced that is frequency shifted, and subject to the loop gain and impedance effects.

For the I channel:

$$V_{2i} = a_s \sin(2\pi(f_s - f_{osc})t - \phi_s) \cdot \quad (33)$$

$$\frac{(G_1 G_2 z_1(f_s - f_{osc}) z_2(f_s - f_{osc}))}{(1 - G_2 G_2' z_1(f_s - f_{osc})}$$
$$z_2(f_s - f_{osc}) - G_1 G_1' z_1(f_s - f_{osc}) z_s(f_s))$$

and if there is strong feedback, either $$|G_1 G_1' z_1(f_s - f_{osc}) z_s(f_s)| \gg 1 \text{ or } |G_2 G_2' z_1(f_s - f_{osc}) z_2(f_s - f_{osc})| \gg 1,$$

then as in equation (20) this reduces to $$V_{2i} \approx -a_s \sin(2\pi(f_s - f_{osc})t - \phi_s) \cdot \frac{G_1 G_2 z_2(f_s - f_{osc})}{G_1 G_1' z_s(f_s) + G_2 G_2' z_2(f_s - f_{osc})} \quad (34)$$

The minus sign is due to $G_1'$ and $G_2'$ being negative. Similarly for the Q channel:

$$V_{2q} = a_s \cos(2\pi(f_s - f_{osc})t - \phi_s) \cdot \quad (35)$$

$$\frac{(G_1 G_2 z_1(f_s - f_{osc}) z_2(f_s - f_{osc}))}{(1 - G_2 G_2' z_1(f_s - f_{osc})}$$
$$z_2(f_s - f_{osc}) - G_1 G_1' z_1(f_s - f_{osc}) z_s(f_s))$$

and if there is strong feedback $$|G_1 G_1' z_1(f_s - f_{osc}) z_s(f_s)| \gg 1 \text{ or } |G_2 G_2' z_1(f_s - f_{osc}) z_2(f_s - f_{osc})| \gg 1,$$

then $$V_{2q} \approx -a_s \cos(2\pi(f_s - f_{osc})t - \phi_s) \cdot \frac{G_1 G_2 z_2(f_s - f_{osc})}{G_1 G_1' z_s(f_s) + G_2 G_2' z_2(f_s - f_{osc})} \quad (36)$$

So from an input signal, frequency $f_s$ and amplitude $a_s$, a quadrature pair of signals are produced at the output, with a frequency of $(f_s - f_{osc})$ and an amplitude $a_2$ of approximately $$a_s \cdot \frac{G_1 G_2 z_2(f_s - f_{osc})}{G_1 G_1' z_s(f_s) + G_2 G_2' z_2(f_s - f_{osc})}.$$

The gain is thus determined by the impedances experienced in the baseband part of the circuitry, together with the source impedance seen at the r.f. input.

Furthermore, as demonstrated by equations (30) to (32) the signal level at the input to the block is modified by the effect of the baseband impedance $z_2$ $(f_s - f_{osc})$. Therefore narrow-band filter effects can be produced, without the need to implement high quality tuned circuits at high frequencies.

The above approximate expression for the amplitude $a_2$ can meaningfully be further rearranged to give a gain of $$\frac{a_2}{a_s} = \frac{G_1}{G_2'} \cdot \frac{z_2(f_s - f_{osc})}{\frac{G_1 G_1'}{G_2 G_2'} z_s(f_s) + z_2(f_s - f_{osc})} \quad (37)$$

The gain between r.f. input and baseband output is then the ratio of the gains acting on the internal common point, $G_1/G_2'$, modified by the impedance across which the signal is developed, the baseband load impedance, $z_2(f_s - f_{osc})$, fed by the r.f. source impedance scaled by the gain ratios and translated to be effective at the baseband output, $$\frac{G_1 G_1'}{G_2 G_2'} z_s(f_s).$$

For the sake of completeness, FIG. 4 shows an impedance translation representation of FIG. 3. The references $z_{rf}$ and $z_{bb}$ respectively mean the radio frequency impedance and the base band impedance. The remainder of the references have the same meaning as used in FIG. 3.

FIG. 5 illustrates a radio receiver which is based on the frequency shifting model shown in FIGS. 3 and 4. The signal source in the case of the receiver is an antenna 30 which is coupled to the signal splitter 28. However the signal source could be an i.f. signal derived from the output of a r.f. front end. The outputs from the respective I and Q circuit blocks are applied to low pass filters 32, 34 which select the wanted products from the frequency translation. A local oscillator 36 is shown connected to a phase shifter 38 which quadrature related local oscillator signals $\cos(\omega_{osc}t)$ and $\sin(\omega_{osc}t)$ to the mixers 221, 241 and 22 Q, 24 Q, respectively. The frequency translation and filtering by the circuit blocks has already been described above and in the interests of brevity will not be repeated again.

FIG. 6 illustrates a transmitter which is based on the frequency shifting model shown in FIGS. 3 and 4. In operation, quadrature related modulating signals $V_i$, $V_q$ represented by the signal sources 40, 42 are applied to the circuit blocks I and Q by way of low pass filters 32, 34. The signals are frequency up-converted in the mixers 241, 24 Q and supplied to a signal combiner 44, which is a reciprocal of a signal splitter, the output of which is coupled to the antenna 30. The signals from the mixers 241, 24 Q are frequency down converted in the mixers 221, 22 Q, respectively.

The oscillator 36 and the phase splitter 38 provide the oscillator signals for up and down conversion, as appropriate.

The mathematical analysis provided above for the frequency shifting model is valid for the transmitter.

FIG. 7 is a simplification of the impedance translation arrangement shown in FIG. 4. The simplification comprises omitting the transconductance amplifiers 121, 12 Q, 181, 18 Q, the conductive links 21 and the impedances zi. In this simplified arrangement the impedance seen looking into one side of the circuit block is (proportional to) the reciprocal of the impedance $z_2$ present at the output of the other side.

In a practical application of the circuit block the impedance $z_2$ presents a high impedance for out-of-band baseband signals. When the impedance is reciprocally translated to r.f., the impedance looking into the circuit block is then low for such signals, reducing their amplitude thereby facilitating the filtering of these signals.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of transmitters and receivers and components therefor and which may be used instead of or in addition to features already described herein.

What is claimed is:

1. A circuit arrangement comprising a first path including a first fequency translation stage, a second path including a second frequency translation stage, an input to the first path being connected to an output of the second path, an output of the first path being connected to an input of the second path, and means for connecting a source of local oscillator signals to the first and second frequency translation stages, wherein the frequency of an input signal is translated by the local oscillator signals to a lower frequency and wherein the impedance as viewed from a higher frequency end of the circuit arrangement is determined by the impedance presented at a lower frequency end of the circuit arrangement.

2. A circuit arrangement as claimed in claim 1, characterised in that the determined impedance relationship is a reciprocal one.

3. A circuit arrangement comprising a first path and a second path, the first path comprising first and second series connected transconductance gain stages, the second path comprising third and fourth transconductance gain stages, each having an inverting output, an input of the third gain stage being coupled to an output of the second gain stage, the output of the fourth gain stage being coupled to an input of the first gain stage, and an output of the first gain stage being coupled to an input of the fourth gain stage, whereby an impedance presented at an output of the second gain stage determines the input impedance presented at the input of the first gain stage.

4. A circuit arrangement as claimed in claim 3, characterised in that an impedance device is coupled to an input of the second gain stage.

5. A circuit arrangement as claimed in claim 3, characterised in that the third and fourth gain stages have negative gains.

6. A circuit arrangement as claimed in claim 3, characterised in that the first gain stage comprises a first transconductance mixer and the fourth gain stage comprises a second transconductance mixer having an inverting output, and in that a source of local oscillator signals is coupled inputs of the first and second mixers.

7. A quadrature receiver comprising input means for connection to a signal source, input signal dividing means coupled to the input means, the dividing means having first and second outputs, first and second circuit arrangements coupled to the first and second outputs, respectively, the first circuit arrangement comprising a first path and a second path, the first path comprising a first transconductance mixer having an output and a first gain stage coupled to the output of the first mixer, and the second path comprising a second transconductance gain stage having an inverting output and a second transconductance mixer coupled to the output of the second gain stage, the second mixer having an inverting output coupled to an input of the first mixer, an output of the first gain stage being coupled to an input of the second gain stage, the output of the second mixer being coupled to an input of the first mixer, and the output of the first mixer being coupled to an input of the second mixer, and the second circuit arrangement comprising a first path and a second path, the first path comprising a third transconductance mixer having an output and a third gain stage coupled to the output of the third mixer, the second path comprising a fourth transconductance gain stage having an inverting output and a fourth transconductance mixer coupled to the output of the fourth gain stage, the fourth mixer having an inverting output coupled to an input of the third mixer, an output of the third gain stage being coupled to an input of the fourth gain stage, the output of the fourth mixer being coupled to an input of the third mixer, and the output of the third mixer being coupled to an input of the fourth mixer, and a local oscillator signal source having first and second quadrature related outputs, the first output being coupled to the first and second mixers and the second output being coupled to the third and fourth mixers.

8. A receiver as claimed in claim 7, characterised in that a first impedance device is coupled to an input of the first gain stage and in that a second impedance device is coupled to the input of the third gain stage.

9. A transmitter comprising first and second means for connection to respective first and second signal sources, first and second circuit arrangements coupled to the respective means for connection to the first and second signal sources, the first circuit arrangement comprising a first path and a second path, the first path comprising a first transconductance gain stage having an inverting output and a first transconductance mixer coupled to the output of the first gain stage, the first mixer having an inverting output, the second path comprising a second transconductance mixer having an output and a second gain stage coupled to the output of the second mixer, the output of the second mixer being coupled to an input of the first mixer, an output of the second gain stage being coupled to an input of the first gain stage, the output of the first mixer being coupled to an input of the second mixer and to a signal combining means, and the second circuit arrangement comprising a first path and a second path, the first path comprising a third transconductance gain stage having an inverting output and a third transconductance mixer coupled to the output of the third gain stage, the third mixer having an inverting output, the second path comprising a fourth transconductance mixer having an output and fourth transconductance gain stage coupled to the output of the fourth mixer, the output of the fourth mixer being coupled to an input of the third mixer, an output of the fourth gain stage being coupled to an input of the third gain stage, and the output of the third mixer being coupled to an input of the fourth mixer and to the signal combining means.

10. An integrated circuit comprising the circuit arrangement as claimed in claim 1.

* * * * *